US011908512B2

(12) United States Patent
Tanaka et al.

(10) Patent No.: US 11,908,512 B2
(45) Date of Patent: *Feb. 20, 2024

(54) 3D NAND FLASH MEMORY DEVICES AND RELATED ELECTRONIC SYSTEMS

(71) Applicant: Micron Technology, Inc., Boise, ID (US)

(72) Inventors: Tomoharu Tanaka, Kanagawa (JP); Yoshiaki Fukuzumi, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/148,684

(22) Filed: Dec. 30, 2022

(65) Prior Publication Data

US 2023/0143421 A1 May 11, 2023

Related U.S. Application Data

(63) Continuation of application No. 17/446,340, filed on Aug. 30, 2021, now Pat. No. 11,562,785.

(51) Int. Cl.
| | |
|---|---|
| *G11C 11/4097* | (2006.01) |
| *G11C 11/4091* | (2006.01) |
| *B81B 7/00* | (2006.01) |
| *H10B 41/20* | (2023.01) |
| *H10B 41/41* | (2023.01) |

(Continued)

(52) U.S. Cl.
CPC .......... *G11C 11/4097* (2013.01); *B81B 7/008* (2013.01); *G11C 11/4091* (2013.01); *H10B 41/20* (2023.02); *H10B 41/41* (2023.02); *H10B 43/20* (2023.02); *H10B 43/40* (2023.02); *B81B 2201/07* (2013.01)

(58) Field of Classification Search
CPC . G11C 11/4097; G11C 11/4091; G11C 16/24; G11C 16/0483; B81B 7/008; B81B 2201/07; H10B 41/20; H10B 41/41; H10B 43/20; H10B 43/40; H10B 41/27; H10B 43/27
USPC ......................................................... 365/63
See application file for complete search history.

(56) References Cited

U.S. PATENT DOCUMENTS

| | | | |
|---|---|---|---|
| 6,400,604 B2 | 6/2002 | Noda |
| 8,456,920 B2 | 6/2013 | Arizono |
| 8,611,153 B2 | 12/2013 | Tanzawa |

(Continued)

*Primary Examiner* — Fernando Hidalgo
(74) *Attorney, Agent, or Firm* — TraskBritt

(57) ABSTRACT

A microelectronic device comprises local digit line structures, global digit line structures, source line structures, sense transistors, read transistors, and write transistors. The local digit line structures are coupled to strings of memory cells. The global digit line structures overlie the local digit line structures. The source line structures are interposed between the local digit line structures and the global digit line structures. The sense transistors are interposed between the source line structures and the global digit line structures, and are coupled to the local digit line structures and the source line structures. The read transistors are interposed between and are coupled to the sense transistors and the global digit line structures. The write transistors are interposed between and are coupled to the global digit line structures and the local digit line structures. Additional microelectronic devices, memory devices, and electronic systems are also described.

20 Claims, 6 Drawing Sheets

(51) Int. Cl.
*H10B 43/20* (2023.01)
*H10B 43/40* (2023.01)

(56) References Cited

U.S. PATENT DOCUMENTS

| | | |
|---|---|---|
| 8,656,092 B2 | 2/2014 | Ha |
| 8,958,228 B2 | 2/2015 | Samachisa et al. |
| 8,971,112 B2 | 3/2015 | Crippa et al. |
| 9,299,442 B2 | 3/2016 | Ha |
| 9,305,660 B2 | 4/2016 | Moschiano et al. |
| 9,343,169 B2 | 5/2016 | Vali et al. |
| 9,672,156 B2 | 6/2017 | Ha |
| 9,679,913 B1 | 6/2017 | Hu et al. |
| 10,468,116 B2 | 11/2019 | Ha |
| 10,510,397 B2 | 12/2019 | Yamada |
| 11,562,785 B1 * | 1/2023 | Tanaka ................ G11C 11/4091 |
| 2009/0268537 A1 | 10/2009 | Kajigaya |
| 2011/0233644 A1 | 9/2011 | Fukuzumi et al. |
| 2012/0182804 A1 | 7/2012 | Hung et al. |
| 2013/0176781 A1 | 7/2013 | Hung |
| 2015/0194380 A1 | 7/2015 | Takaki et al. |
| 2016/0099047 A1 * | 4/2016 | Lee ..................... G11C 11/5642 365/185.03 |
| 2018/0364908 A1 | 12/2018 | Lea et al. |
| 2018/0365293 A1 | 12/2018 | De et al. |
| 2020/0118615 A1 | 4/2020 | Yamada |
| 2020/0258897 A1 | 8/2020 | Yan et al. |
| 2021/0210506 A1 | 7/2021 | Yan et al. |
| 2022/0020761 A1 | 1/2022 | Yeh et al. |
| 2022/0068957 A1 | 3/2022 | Yeh et al. |

* cited by examiner

3D NAND FLASH MEMORY DEVICES AND RELATED ELECTRONIC SYSTEMS

CROSS-REFERENCE TO RELATED APPLICATION

This application is a continuation of U.S. patent application Ser. No. 17/446,340, filed Aug. 30, 2021, now U.S. Pat. No. 11,562,785, issued Jan. 24, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including local digit line structures and global digit line structures, and to related memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through a stack structure including tiers of conductive structures and insulative materials. Each string of memory cells may include at least one select device coupled in series to a serial combination of vertically stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional (2D)) arrangements of transistors.

In a conventional non-volatile memory device (e.g., a conventional 3D NAND Flash memory device) including a vertical memory array, digit lines (e.g., bit lines, data lines) are coupled to the strings of memory cells of the vertical memory array, and openings are provided next to edges of the vertical memory array to accommodate digit line contacts for each of the digit lines. The digit line contacts electrically connect the digit lines to logic circuitry to facilitate operations (e.g., read operations, program operations, erase operations) on the strings of memory cells of the vertical memory array. However, conventional configurations of digit lines and logic circuitry can hamper improvements in the performance (e.g., data transfer rates, power consumption) of the non-volatile memory device, and/or can impede reductions to the sizes (e.g., horizontal footprints) of features of the non-volatile memory device.

DETAILED DESCRIPTION

Figure 1A:
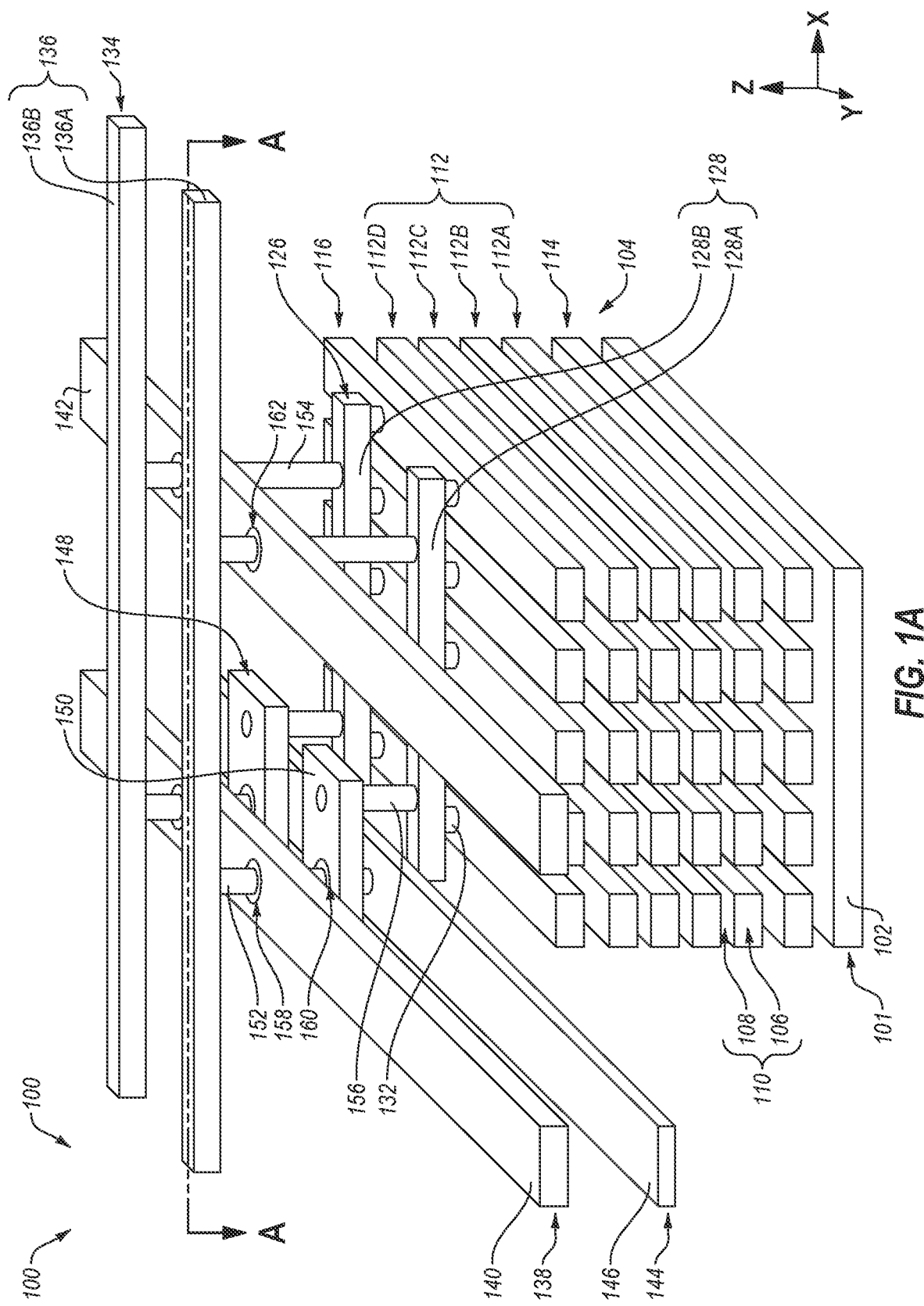
FIG. 1A is simplified, partial perspective view of a microelectronic device structure for a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional DRAM), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate e.g., horizontally closest to) one another.

As used herein, the term "intersection" means and includes a location at which two or more features (e.g., regions, structures, materials, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide (MgO)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a region, a structures, a material) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figure 1B:
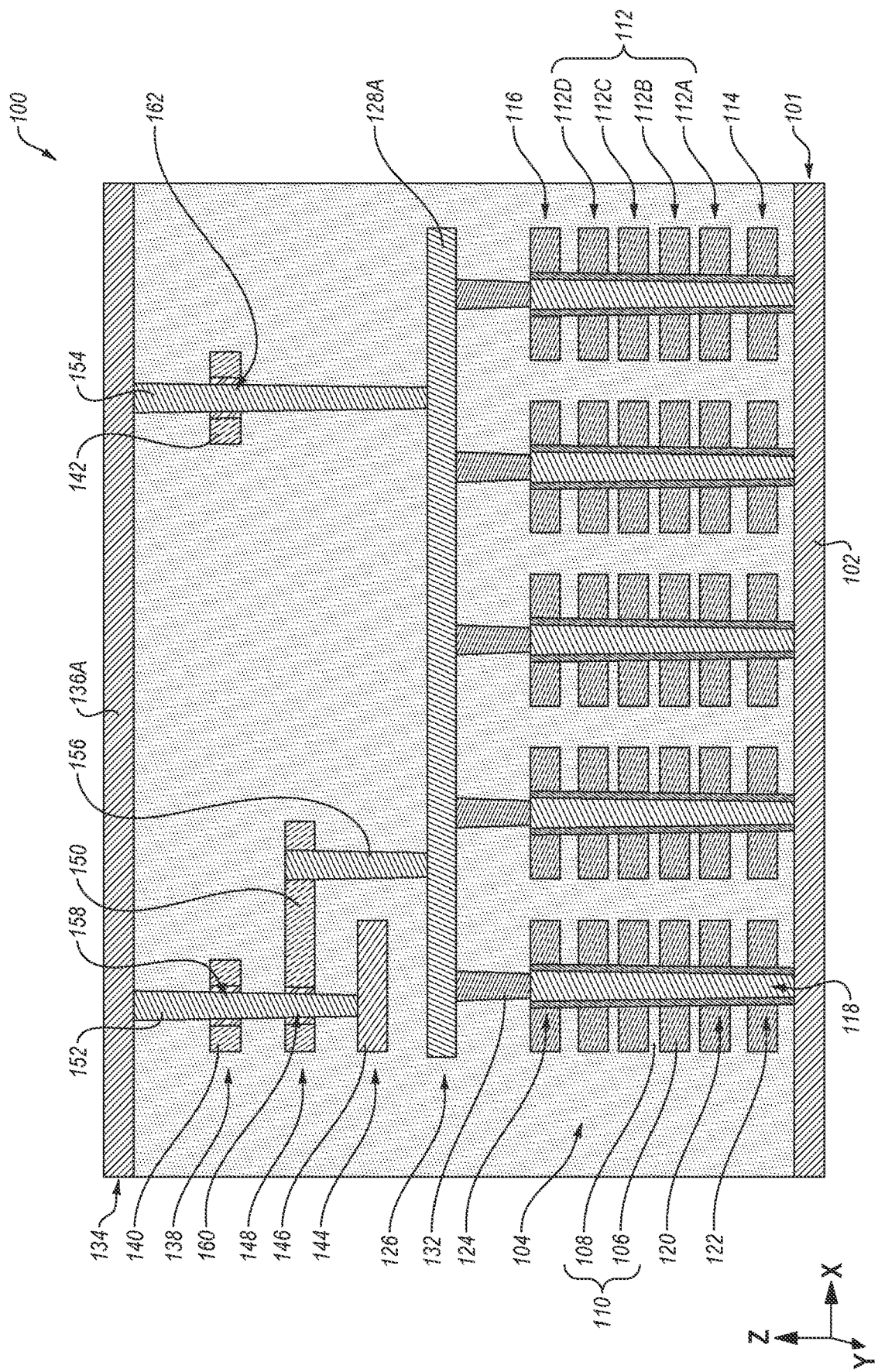
FIG. 1B is simplified, partial cross-sectional view of the microelectronic device structure shown in FIG. 1A.
Figure 1C:
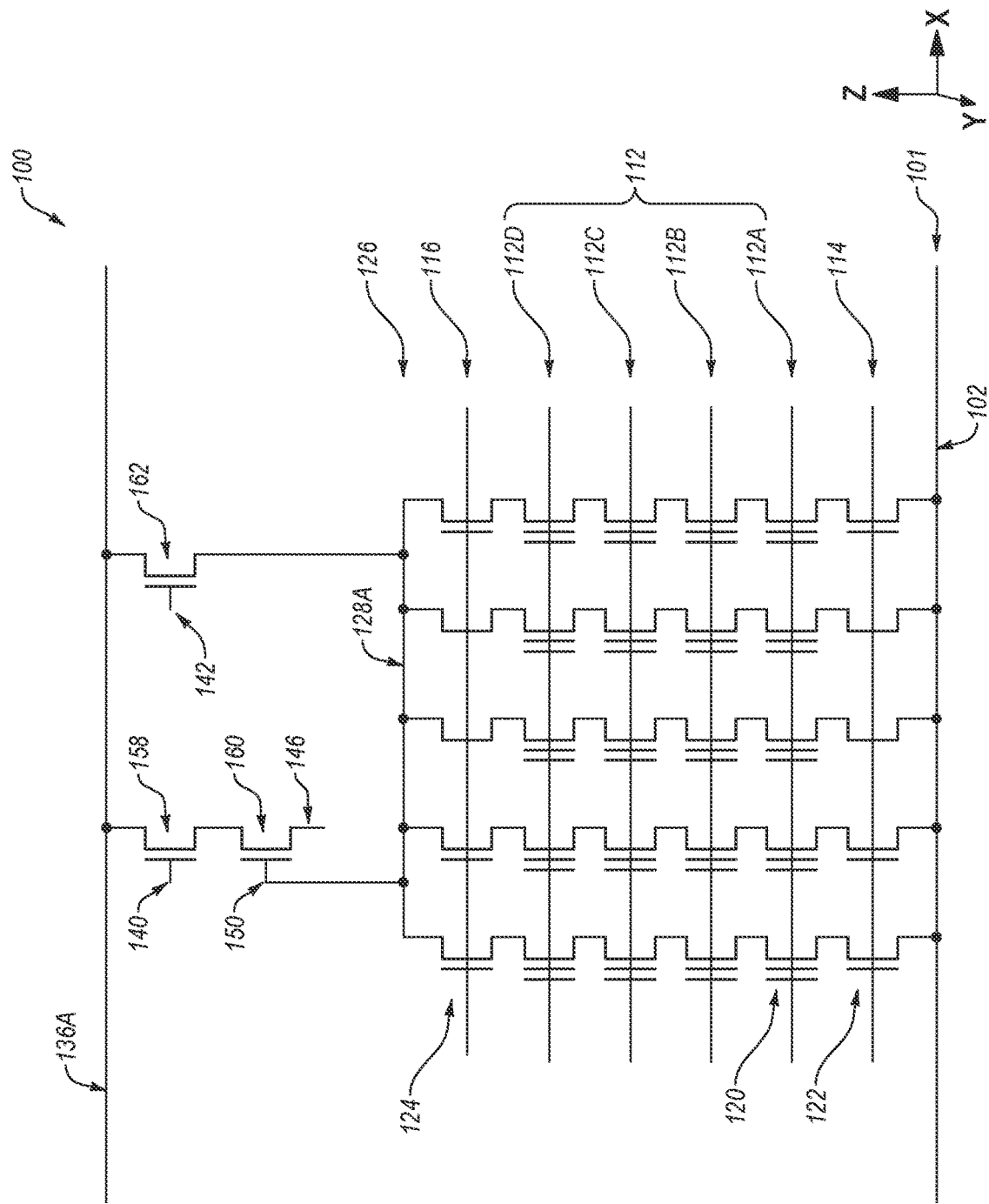
FIG. 1C is a schematic diagram of circuity of the section of the microelectronic device structure shown in FIG. 1B.

FIG. 1A is a simplified, partial perspective view of a microelectronic device structure 100 (e.g., a memory device structure, such as a 3D NAND Flash memory device structure) for a microelectronic device (e.g., a memory device, such as a 3D NAND Flash memory device), in accordance with embodiments of the disclosure. FIG. 1B is simplified, partial cross-sectional view of the microelectronic device structure 100 about dashed line A-A depicted in FIG. 1A. FIG. 1C is a schematic diagram of circuity of the section of the microelectronic device structure 100 shown in FIG. 1B. For clarity and ease of understanding of the drawings and related description, not all features (e.g., regions, structures, materials, devices) of the microelectronic device structure 100 depicted in one or more of FIGS. 1A through 1C are depicted in one of more others of FIGS. 1A through 1C. With the description provided below, it will be readily apparent to one of ordinary skill in the art that the structures and devices described herein may be included in relatively larger structures, devices, and systems.

Referring collectively to FIGS. 1A and 1B, the microelectronic device structure 100 may be formed to include a source tier 101; a stack structure 104 vertically overlying (e.g., in the Z-direction) the source tier 101; a local digit line tier 126 vertically overlying the stack structure 104; a global digit line tier 134 vertically overlying the local digit line tier 126; a read/write electrode tier 138 vertically interposed between the local digit line tier 126 and the global digit line tier 134; a source line tier 144 vertically interposed between the local digit line tier 126 and the read/write electrode tier 138; and a routing tier 148 vertical interposed between the source line tier 144 and the read/write electrode tier 138. As described in further detail below, the microelectronic device structure 100 includes various features (e.g., regions, structures, materials, devices) individually operatively associated with (e.g., within; extending to, into, through, and/or between; physically and/or electrically connected to additional features of) one or more of the source tier 101, the stack structure 104, the local digit line tier 126, the global digit line tier 134, the read/write electrode tier 138, the source line tier 144, and the routing tier 148.

The source tier 101 may include at least one source structure 102 (e.g., a source plate) at least partially positioned with a horizontal area of the stack structure 104 vertically overlying the source tier 101. The source structure 102 may be formed and include conductive material, such as one or more of a metal, an alloy, and a conductive metal-containing material (e.g., a conductive metal nitride, a conductive metal silicide, a conductive metal carbide, a conductive metal oxide). As a non-limiting example, the source structure 102 may be formed of and include W.

The stack structure 104 of the microelectronic device structure 100 may be formed to include a vertically alternating (e.g., in the Z-direction) sequence of conductive structures 106 and insulative structures 108 arranged in tiers 110. The conductive structures 106 may be vertically interleaved with the insulative structures 108. Each of the tiers 110 of the stack structure 104 may include at least one of the conductive structures 106 vertically neighboring at least one of the insulative structures 108. The stack structure 104 may be formed to include any desired number of the tiers 110, such as greater than or equal to sixteen (16) of the tiers 110, greater than or equal to thirty-two (32) of the tiers 110, greater than or equal to sixty-four (64) of the tiers 110, greater than or equal to one hundred and twenty-eight (128) of the tiers 110, or greater than or equal to two hundred and fifty-six (256) of the tiers 110.

The conductive structures 106 of the tiers 110 of the stack structure 104 may be formed of and include conductive material. By way of non-limiting example, the conductive structures 106 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive structures 106 are formed of and include W. Each of the conductive structures 106 may individually be substantially homogeneous, or one or more of the conductive structures 106 may individually be substantially heterogeneous. In some embodiments, each of the conductive structures 106 is formed to be substantially homogeneous.

Optionally, one or more liner materials(s) (e.g., insulative liner material(s), conductive wirer material(s)) may also be formed around the conductive structures 106. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 106. In some embodiments, the liner material(s) comprise titanium nitride. In further embodiments, the liner material(s) further include aluminum oxide. As a non-limiting example, aluminum oxide may be formed directly adjacent the insulative structures 108, titanium nitride may be formed directly adjacent the aluminum oxide, and tungsten may be formed directly adjacent the titanium nitride. For clarity and ease of understanding the description, the liner material(s) are not illustrated in FIGS. 1A and 1B, but it will be understood that the liner material(s) may be disposed around the conductive structures 106.

The insulative structures 108 of the tiers 110 of the stack structure 104 may be formed of and include insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 108 is formed of and includes a dielectric oxide material, such as $SiO_x$ (e.g., $SiO_2$). Each of the insulative structures 108 may individually be substantially homogeneous, may be substantially heterogeneous. In some embodiments, each of the insulative structures 108 is substantially homogeneous.

As shown in FIGS. 1A and 1B, the tiers 110 of the stack structure 104 may be sub-divided into access line tiers 112, at least one select gate tier 114 (e.g., a lower select gate tier), and at least one additional select gate tier 116 (e.g., an upper select gate tier). The access line tiers 112 may be vertically interposed between the select gate tier 114 and the additional select gate tier 116. At least some of the conductive structures 106 within the access line tiers 112 may be employed as local access line structures (e.g., local word line structures) for the microelectronic device structure 100. At least one of the conductive structures 106 within the select gate tier 114 may employed as at least one first select gate structure (e.g., at least one source side select gate (SGS) structure) for the microelectronic device structure 100. At least one of the conductive structures 106 within the additional select gate tier 116 may employed as at least one second select gate structure (e.g., at least one drain side select gate (SGD) structure) for the microelectronic device structure 100. In some embodiments, horizontally neighboring (e.g., in the X-direction) conductive structures 106 within the additional select gate tier 116 are employed as additional select gate structures (e.g., SGD structures) for the microelectronic device structure 100.

As depicted in FIGS. 1A and 1B, in some embodiments the stack structure 104 includes four (4) access line tiers 112 (e.g., a first access line tier 112A, a second access line tier 112B, a third access line tier 112C, and a fourth access line tier 112D), one select gate tier 114, and one additional select gate tier 116. However, the stack structure 104 may be formed to include a different quantity of access line tiers 112 (e.g., greater than four (4) access line tiers 112), a different quantity of select gate tiers 114 (e.g., greater than one select gate tier 114, such as two or more select gate tiers 114), and/or a different quantity of additional select gate tiers 116 (e.g., greater than one additional select gate tier 116, such as two or more additional select gate tiers 116, three or more additional select gate tiers 116, or four or more additional select gate tiers 116).

Referring to FIG. 1B, the first pillar structures 118 may vertically extend through the tiers 110 of the stack structure 104. The first pillar structures 118 may each individually be formed of and include a stack of materials. By way of non-limiting example, each of the first pillar structures 118 may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second dielectric oxide material (e.g., $SiO_x$, such as $SiO_2$); a channel material, such as a semiconductor material (e.g., silicon, such as polycrystalline silicon); and a dielectric fill material (e.g., a dielectric oxide, a dielectric nitride, air). The charge-blocking material may be formed on or over surfaces of the conductive structures 106 and the insulative structures 108 of the tiers 110 of stack structure 104 at least partially defining horizontal boundaries of the first pillar structures 118; the charge-trapping material may be horizontally surrounded by the charge-blocking material; the tunnel dielectric material may be horizontally surrounded by the charge-trapping material; the channel material may be horizontally surrounded by the tunnel dielectric material; and the dielectric fill material may be horizontally surrounded by the channel material.

Intersections of the first pillar structures 118 and the conductive structures 106 within the access line tiers 112 of the stack structure 104 may define vertically extending strings of memory cells 120 coupled in series with one another within the stack structure 104. In some embodiments, the memory cells 120 formed at the intersections of the conductive structures 106 and the first pillar structures 118 within access line tiers 112 of the stack structure 104 comprise so-called "MONOS" (metal-oxide-nitride-oxide-semiconductor) memory cells. In additional embodiments, the memory cells 120 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 120 comprise so-called "floating gate" memory cells including floating gates (e.g., metallic floating gates) as charge storage structures. The floating gates may horizontally intervene between central structures of the first pillar structures 118 and the conductive structures 106 of the different access line tiers 112 of the stack structure 104. The vertically extending strings of memory cells 120 together form at least one memory array within the stack structure 104.

Still referring to FIG. 1B, intersections of the first pillar structures 118 and the conductive structures 106 within the select gate tier 114 of the stack structure 104 may define select transistors 122 coupled in series with the vertically extending strings of memory cells 120. Portions of the first pillar structures 118 within vertical boundaries of the select gate tier 114 of the stack structure 104 may include the tunnel dielectric material (e.g., $SiO_x$, such as $SiO_2$), the channel material (e.g., silicon, such as polycrystalline silicon), and the dielectric fill (e.g., $SiO_x$, such as $SiO_2$; $SiN_y$, such as $Si_3N_4$; air), but may be at least partially (e.g., substantially) free of the charge-blocking material and the charge-trapping material present within additional portions of the first pillar structures 118 within vertical boundaries of the access line tiers 112 of the stack structure 104. In some embodiments, the select transistors 122 comprise metal-oxide-semiconductor (MOS) transistors. If the conductive structures 106 within the select gate tier 114 of the stack structure 104 are employed as SGS structures for the microelectronic device structure 100, the select transistors 122 may comprise MOS-SGS transistors.

In addition, intersections of the first pillar structures 118 and the conductive structures 106 within the additional select gate tier 116 of the stack structure 104 may define additional select transistors 124 coupled in series with the vertically extending strings of memory cells 120. Further portions of the first pillar structures 118 within vertical boundaries of the additional select gate tier 116 of the stack structure 104 may include the tunnel dielectric material (e.g., $SiO_x$, such as $SiO_2$), the channel material (e.g., silicon, such as polycrystalline silicon), and the dielectric fill (e.g., $SiO_x$, such as $SiO_2$, $SiN_y$, such as $Si_3N_4$; air), but may be at least partially (e.g., substantially) free of the charge-blocking material and the charge-trapping material included within the additional portions of the first pillar structures 118 within the vertical boundaries of the access line tiers 112 of the stack structure 104. In some embodiments, the additional select transistors 124 comprise MOS transistors. If the conductive structures 106 within the additional select gate tier 116 of the stack structure 104 are employed as SGD structures for the microelectronic device structure 100, the additional select transistors 124 may comprise MOS-SGD transistors.

Collectively referring to FIGS. 1A and 1B, the local digit line tier 126 may include multiple (e.g., more than one, a plurality of) local digit line structures 128. The local digit line structures 128 may vertically overlie the first pillar structures 118 (FIG. 1B), and may individually horizontally extend in the X-direction (e.g., a first horizontal direction). The local digit line tier 126 may include rows of the local digit line structures 128 extending in the X-direction, and columns of the local digit line structures 128 extending in the Y-direction (e.g., a second horizontal direction) orthogonal to the X-direction. A group of the local digit line structures 128 provided within an individual row of the local digit line structures 128 may be substantially horizontally aligned with one another in the Y-direction, may be horizontally separated from one another in the X-direction, and may horizontally extend in series with one another in the X-direction. As described in further detail below, those local digit line structures 128 provided within the same row of the local digit line structures 128 as one another may be operatively associated with the same global digit line structure as one another. In addition, a group of the local digit line structures 128 provided within an individual column of the local digit line structures 128 may be substantially horizontally aligned with one another in the X-direction, may be horizontally separated from one another in the Y-direction, and may extend in parallel with one another in the X-direction. By way of non-limiting example, as depicted in FIG. 1A, an individual column of the local digit line structures 128 may include a first local digit line structure 128A and a second local digit line structure 128B spaced apart from the first local digit line structure 128A. As described in further detail below, those local digit line structures 128 provided within the same column of the local digit line structures 128 as one another may be operatively associated with the different global digit line structures than one another.

The local digit line structures 128 may each individually be formed of and include conductive material. By way of non-limiting example, the local digit line structures 128 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the local digit line structures 128 are each individually formed of and include one or more of W, Ru, Mo, and titanium nitride ($TiN_y$). Each of the local digit line structures 128 may individually be substantially homogeneous, or one or more of the local digit line structures 128 may individually be substantially heterogeneous. In some embodiments, each of the local digit line structures 128 are formed to be substantially homogeneous.

Still referring to FIGS. 1A and 1B, the microelectronic device structure 100 further includes first conductive contact structures 132 vertically intervening between and electrically connecting at least some of the local digit line structures 128 and at least some of first pillar structures 118 (FIG. 1B). The first conductive contact structures 132 may each individually be formed of and include conductive material. By way of non-limiting example, the first conductive contact structures 132 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first conductive contact structures 132 are each individually formed of and include one or more of W, Ru, Mo, and $TiN_y$.

The global digit line tier 134 may include multiple (e.g., more than one, a plurality of) global digit line structures 136. The global digit line structures 136 may vertically overlie the local digit line structures 128, and may individually horizontally extend in the X-direction. The global digit line structures 136 may be horizontally separated from one another in the Y-direction, and may extend in parallel with one another in the X-direction. As non-limiting example, as depicted in FIG. 1A, the global digit line tier 134 may include a first global digit line structure 136A and a second global digit line structure 136B spaced apart from the first global digit line structure 136A. Different global digit line structures 136 may be operatively associated with different local digit line structures 128 than one another. Each of the global digit line structures 136 may be operatively associated with an individual row of the local digit line structures 128, with different global digit line structures 136 (e.g., the first global digit line structure 136A, the second global digit line structure 136B) operatively associated with different rows of the local digit line structures 128 than one another.

For example, the first global digit line structure 136A may be operatively associated with the first local digit line structure 128A and at least one additional local digit line structure 128 within the same row (e.g., a first row) of the local digit line structures 128 as the first local digit line structure 128A; and the second global digit line structure 136B (FIG. 1A) may be operatively associated with the second local digit line structure 128B (FIG. 1A) and at least one further local digit line structure 128 within the same row (e.g., a second row) of the local digit line structures 128 as the second local digit line structure 128B. In addition, each column the local digit line structures 128 may be operatively associated with multiple global digit line structures 136. For example, the first local digit line structure 128A and the second local digit line structure 128B within the same column (e.g., a first column) of the local digit line structures 128 as one another may be operatively associated with the first global digit line structure 136A and the second global digit line structure 136B, respectively. The global digit line structures 136 may be operatively associated with the local digit line structures 128, at least in part, by way of additional features of the microelectronic device structure 100 individually operatively associated with one or more of the read/write electrode tier 138, the source line tier 144, and the routing tier 148, as described in further detail below. Horizontal dimensions (e.g., lengths) in the X-direction of the global digit line structures 136 may be greater than (e.g., longer than) horizontal dimensions (e.g., lengths) in the X-direction of the local digit line structures 128 operatively associated therewith.

The global digit line structures 136 may each individually be formed of and include conductive material. By way of non-limiting example, the global digit line structures 136 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the global digit line structures 136 are each individually formed of and include one or more of W, Ru, Mo, and $TiN_y$. Each of the global digit line structures 136 may individually be substantially homogeneous, or one or more of the global digit line structures 136 may individually be substantially heterogeneous. In some embodiments, each of the global digit line structures 136 is formed to be substantially homogeneous.

The global digit line structures 136 may be coupled to logic circuity (e.g., page buffer circuitry) of a microelectronic device including the microelectronic device structure 100. The logic circuity may, for example, be included within a base structure vertically underlying the microelectronic device structure 100. In some embodiments, the global digit line structures 136 are coupled to page buffer devices each individually including an arrangement of data cache circuitry (e.g., dynamic data cache (DDC) circuitry, primary data cache (PDC) circuitry, secondary data cache (SDC) circuitry, temporary data cache (TDC) circuitry), sense amplifier (SA) circuitry, and digit line pre-charge circuitry. Optionally, isolation devices (e.g., isolation transistors) may be interposed between the global digit line structures 136 and the page buffer devices at desirable locations along conductive paths extending from and between the global digit line structures 136 and the page buffer devices. In some embodiments, the isolation devices comprise high-voltage-isolation (HVISO) transistors configured and operated to pass voltages greater than or equal to about 18V, such as within a range of from about 18V to about 25V. In additional embodiments, the isolation devices comprise low-voltage-isolation (LVISO) transistors configured and operated to substantially block applied voltages less than about 18 V while in an OFF state (e.g., an inactive state, a depletion state, a deselected state).

Still referring to FIGS. 1A and 1B, the read/write electrode tier 138 may include read electrode structures 140 and write electrode structures 142. The read electrode structures 140 and the write electrode structures 142 may vertically interposed between the local digit line structures 128 and the global digit line structures 136, and may individually horizontally extend the Y-direction orthogonal to the X-direction in which the local digit line structures 128 and the global digit line structures 136 horizontally extend. Each of the local digit line structures 128 may be operatively associated with one of the read electrode structures 140 and one of the write electrode structures 142, as described in further detail below. In addition, each of the global digit line structures 136 may be operatively associated multiple (e.g., more than one) of the read electrode structures 140 and multiple (e.g., more than one) of the write electrode structures 142, as also described in further detail below.

The read electrode structures 140 are spaced apart from the write electrode structures 142 in the X-direction, and may horizontally extend in parallel with one another and the write electrode structures 142 in the Y-direction. As described in further detail below, the read electrode structures 140 may be employed as gate structures for switching transistors (e.g., read transistors) of the microelectronic device structure 100. Each of the read electrode structures 140 may be operatively associated with a group of the local digit line structures 128 within an individual column of the local digit line structures 128. For example, as shown in FIG. 1A, the first local digit line structure 128A and the second local digit line structure 128B within the same column of the local digit line structures 128 as one another may each be operatively associated with a single (e.g., only one) read electrode structure 140 of the read/write electrode tier 138. Different groups of the local digit line structures 128 within different columns of the local digit line structures 128 than one another may be operatively associated with different read electrode structures 140 than one another. In addition, each of the read electrode structures 140 may be operatively associated with multiple (e.g., more than one) of the global digit line structures 136. For example, as shown in FIG. 1A, an individual read electrode structure 140 may be operatively associated with each of the first global digit line structure 136A and the second global digit line structure 136B. Moreover, each of the global digit line structures 136 may be operatively associated with multiple (e.g., more than one) read electrode structures 140 of the read/write electrode tier 138. For example, the first global digit line structure 136A and the second global digit line structure 136B may each be operatively associated with more than one of the read electrode structures 140 (e.g., the read electrode structure 140 shown in FIG. 1A, and at least one additional read electrode structure 140 operatively associated with at least one additional column of the local digit line structures 128).

Still referring to FIG. 1A, the write electrode structures 142 may horizontally alternate with the read electrode structures 140 in the X-direction. As described in further detail below, the write electrode structures 142 may be employed as gate structures for additional switching transistors (e.g., write transistors) of the microelectronic device structure 100. Each of the write electrode structures 142 may be operatively associated with a group of the local digit line structures 128 within an individual column of the local digit line structures 128. Each column of the local digit line structures 128 may be operatively associated with a single (e.g., only one) write electrode structure 142 and a single read electrode structure 140 horizontally neighboring (e.g., in the X-direction) the single write electrode structure 142. For example, the first local digit line structure 128A and the second local digit line structure 128B within the same column of the local digit line structures 128 as one another may each be operatively associated with a single write electrode structure 142 of the read/write electrode tier 138. Different groups of the local digit line structures 128 within different columns of the local digit line structures 128 than one another may be operatively associated with different write electrode structures 142 than one another. In addition, each of the write electrode structures 142 may be operatively associated with multiple (e.g., more than one) of the global digit line structures 136. For example, as shown in FIG. 1A, an individual write electrode structure 142 may be operatively associated with each of the first global digit line structure 136A and the second global digit line structure 136B. Moreover, each of the global digit line structures 136 may be operatively associated with multiple (e.g., more than one) write electrode structures 142 of the read/write electrode tier 138. For example, the first global digit line structure 136A and the second global digit line structure 136B may each be operatively associated with more than one of the write electrode structures 142 (e.g., the write electrode structure 142 shown in FIG. 1A, and at least one additional write electrode structure 142 operatively associated with at least one additional column of the local digit line structures 128).

The read electrode structures 140 and the write electrode structures 142 may each individually be formed of and include conductive material. By way of non-limiting example, the read electrode structures 140 and the write electrode structures 142 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the read electrode structures 140 and the write electrode structures 142 are each individually formed of and include one or more of W, Ru, Mo, and $TiN_y$. Each of the read electrode structures 140 and the write electrode structures 142 may individually be substantially homogeneous, or one or more of the read electrode structures 140 and/or one or more of the write electrode structures 142 may individually be substantially heterogeneous. In some embodiments, each of the read electrode structures 140 and each of the write electrode structures 142 is formed to be substantially homogeneous.

Referring collectively to FIGS. 1A and 1B, the source line tier 144 includes source line structures 146. The source line structures 146 may vertically interposed between the local digit line structures 128 of the local digit line tier 126 and the read electrode structures 140 of the read/write electrode tier 138. The source line structures 146 may individually horizontally extend the Y-direction orthogonal to the X-direction in which the local digit line structures 128 and the global digit line structures 136 horizontally extend. As described in further detail below, each of the local digit line structures 128 may individually be operatively associated with one of the source line structures 146, and each of the read electrode structures 140 may individually be operatively associated with one of the source line structures 146. In addition, as also described in further detail below, each of the global digit line structures 136 may individually be operatively associated multiple (e.g., more than one) of the source line structures 146.

As shown in FIG. 1A, each of the source line structures 146 may individually be operatively associated with one of the read electrode structures 140 and a group of the local digit line structures 128 within an individual column of the local digit line structures 128. For example, the first local digit line structure 128A and the second local digit line structure 128B within the same column of the local digit line structures 128 as one another, and a single (e.g., only one) read electrode structure 140 operatively associated therewith, may each be operatively associated with a single (e.g., only one) source line structure 146 of the source line tier 144. Different groups of the local digit line structures 128 within different columns of the local digit line structures 128 than one another, and different read electrode structures 140 operatively associated with the different columns of the local digit line structures 128, may be operatively associated with different source line structures 146 than one another. In addition, each of the source line structures 146 may be operatively associated with multiple (e.g., more than one) of the global digit line structures 136. For example, as shown in FIG. 1A, an individual source line structure 146 may be operatively associated with each of the first global digit line structure 136A and the second global digit line structure 136B. Moreover, each of the global digit line structures 136 may be operatively associated with multiple (e.g., more than one) source line structures 146 of the source line tier 144. For example, the first global digit line structure 136A and the second global digit line structure 136B may each be operatively associated with more than one of the source line structures 146 (e.g., the source line structure 146 shown in FIG. 1A, and at least one additional source line structure 146 operatively associated with at least one additional column of the local digit line structures 128).

The source line structures 146 may each individually be formed of and include conductive material. By way of non-limiting example, the source line structures 146 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the source line structures 146 are each individually formed of and include one or more of W, Ru, Mo, and $TiN_y$. Each of the source line structures 146 may individually be substantially homogeneous, or one or more of the source line structures 146 may individually be substantially heterogeneous. In some embodiments, each of the source line structures 146 is formed to be substantially homogeneous.

Referring to FIGS. 1A and 1B, the routing tier 148 includes routing structures 150. The routing structures 150 may be vertically interposed between the source line structures 146 of the source line tier 144 and the read electrode structures 140 of the read/write electrode tier 138. The routing structures 150 may individually horizontally extend the X-direction. As described in further detail below, each of the routing structures 150 may be operatively associated with one of the local digit line structures 128, one of the source line structures 146, one of the read electrode structures 140, and one of the global digit line structures 136. In addition, as also described in further detail below, each of the global digit line structures 136 may be operatively associated multiple (e.g., more than one, a plurality) of the routing structures 150.

As shown in FIG. 1A, each of the routing structures 150 may individually be operatively associated with one of the local digit line structures 128. For example, the first local digit line structure 128A may be operatively associated with one of the routing structures 150, and the second local digit line structure 128B may be operatively associated with another one of the routing structures 150. The routing structures 150 may be coupled to the local digit line structures 128. As described in further detail below, routing structures 150 may be employed as gate structures for sense transistors interposed between and operatively associated with the source line structures 146 and the read electrode structures 140. Different groups of the local digit line structures 128 within different columns of the local digit line structures 128, and different read electrode structures 140 operatively associated with the different columns of the local digit line structures 128, may be operatively associated with different groups of the routing structures 150 than one another. In addition, each of the routing structures 150 may individually be operatively associated with one of the global digit line structures 136. For example, as shown in FIG. 1A, the first global digit line structure 136A may be operatively associated with one of the routing structures 150 operatively associated with the first local digit line structure 128A; and the second global digit line structure 136B may be operatively associated with another one of the routing structures 150 operatively associated with the second local digit line structure 128B. Moreover, each of the global digit line structures 136 may be operatively associated with multiple (e.g., more than one) routing structures 150 of the routing tier 148. For example, the first global digit line structure 136A may be operatively associated with different routing structures 150 operatively associated with different local digit line structures 128 within an individual row of the local digit line structures 128 extending in the X-direction; and the second global digit line structure 136B may be operatively associated with other different routing structures 150 operatively associated with other different local digit line structures 128 within another individual row of the local digit line structures 128 extending in the X-direction.

The routing structures 150 may each individually be formed of and include conductive material. By way of non-limiting example, the routing structures 150 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the routing structures 150 are each individually formed of and include one or more of W, Ru, Mo, and $TiN_y$. Each of the routing structures 150 may individually be substantially homogeneous, or one or more of the routing structures 150 may individually be substantially heterogeneous. In some embodiments, each of the routing structures 150 is formed to be substantially homogeneous.

Still referring to FIGS. 1A and 1B, the microelectronic device structure 100 further includes second pillar structures 152 operatively associated with the local digit line structures 128, the source line structures 146, the routing structures 150, the read electrode structures 140, and the global digit line structures 136. The second pillar structures 152 may individually vertically extend from one of the global digit line structures 136 (e.g., the first global digit line structure 136A, the second global digit line structure 136B), through each of one of the read electrode structures 140 and one of the routing structures 150, and at least to (e.g., to, into, beyond) one of the source line structures 146.

The second pillar structures 152 may at least be formed of and include semiconductor material (e.g., silicon, such as polycrystalline silicon; an oxide semiconductor material). One or more vertical regions of the semiconductor material of the second pillar structures 152 may be doped, or the semiconductor material of the second pillar structures 152 may be substantially undoped. If doped, the semiconductor material of the second pillar structures 152 may be doped with one or more conductivity-enhancing species (e.g., one or more N-type dopants, such as one or more of phosphorus, arsenic, antimony, and bismuth; one or more P-type dopants, such as one or more of boron, aluminum, and gallium) facilitating desired vertical transistors at intersections of the read electrode structures 140 and the routing structures 150, as described in further detail below. In some embodiments, the second pillar structures 152 are each individually formed of and include a stack of materials. For example, each of the second pillar structures 152 may at least include the semiconductor material, and a tunnel dielectric material (e.g., a dielectric oxide material, such as $SiO_x$) horizontally surrounding and covering at least portions of the second pillar structure 152 at intersections of the second pillar structure 152 and one of the read electrode structures 140 and one of the routing structures 150. In addition, each of the second pillar structures 152 may, optionally, include one or more conductive materials vertically interposed between the semiconductor material thereof and at least one (e.g., each) of the global digit line structure 136 operatively associated therewith and the source line structure 146 operatively associated therewith.

Still referring to FIGS. 1A and 1B, intersections of the second pillar structures 152 and the read electrode structures 140 may define read transistors 158 (e.g., first switching transistors) of the microelectronic device structure 100. The read transistors 158 may comprise vertical transistors including a channel region vertically offset from source/drain regions. In some embodiments, the read transistors 158 comprise MOS transistors. Channel regions of the read transistors 158 may be positioned within vertical boundaries of the read electrode structures 140; and source/drain regions of the read transistors 158 may vertically neighbor the channel regions, and may be vertically offset from the read electrode structures 140. Tunnel dielectric material of the second pillar structures 152 may be horizontally interposed between the semiconductor material of the second pillar structures 152 and the read electrode structures 140 within vertical boundaries of the read electrode structures 140, and may serve as gate dielectric structures for the read transistors 158.

In addition, intersections of the second pillar structures 152 and the routing structures 150 may define sense transistors 160 of the microelectronic device structure 100. The sense transistors 160 may comprise vertical transistors including a channel region vertically offset from source/drain regions. For each second pillar structure 152, the sense transistor 160 defined thereby may be provided in series with the read transistor 158 defined thereby. As a non-limiting example, for an individual sense transistor 160 defined by an individual second pillar structure 152, a drain region of the sense transistor 160 may be coupled to a source region of an individual read transistor 158 vertically overlying the sense transistor 160 and defined by the second pillar structure 152. The sense transistor 160 defined by the second pillar structure 152 may be physically and electrically interposed between the read transistor 158 defined by the second pillar structure 152 and the each of the source line structure 146 and the local digit line structure 128 operatively associated with the second pillar structure 152. In some embodiments, the sense transistors 160 comprise MOS transistors. In some such embodiments, the sense transistors 160 comprise PMOS transistors, so that conductive structures 106 (e.g., employed as local access line structures) of the stack structure 104 may be driven from LOW to HIGH. Channel regions of the sense transistors 160 may be positioned within vertical boundaries of the routing structures 150; and source/drain regions of the sense transistors 160 may vertically neighbor the channel regions, and may be vertically offset from the routing structures 150. Tunnel dielectric material of the second pillar structures 152 may be horizontally interposed between the semiconductor material of the second pillar structures 152 and the routing structures 150 within vertical boundaries of the routing structures 150, and may serve as gate dielectric structures for the sense transistors 160.

Still referring to FIGS. 1A and 1B, the microelectronic device structure 100 further includes third pillar structures 154 operatively associated with the local digit line structures 128, the write electrode structures 142, and the global digit line structures 136. The third pillar structures 154 may individually vertically extend from one of the global digit line structures 136 (e.g., the first global digit line structure 136A, the second global digit line structure 136B), through one of the write electrode structures 142, and at least to (e.g., to, into) one of the local digit line structures 128 (e.g., the first local digit line structure 128A, the second local digit line structure 128B).

The third pillar structures 154 may at least be formed of and include semiconductor material (e.g., silicon, such as polycrystalline silicon; oxide semiconductor material). One or more vertical regions of the semiconductor material of the third pillar structures 154 may be doped, or the semiconductor material of the third pillar structures 154 may be substantially undoped. If doped, the semiconductor material of the third pillar structures 154 may be doped with one or more conductivity-enhancing species (e.g., one or more N-type dopants, such as one or more of phosphorus, arsenic, antimony, and bismuth; one or more P-type dopants, such as one or more of boron, aluminum, and gallium) facilitating desired vertical transistors at intersections of the write electrode structures 142, as described in further detail below. In some embodiments, the third pillar structures 154 are each individually formed of and include a stack of materials. For example, each of the third pillar structures 154 may at least include the semiconductor material, and a tunnel dielectric material (e.g., a dielectric oxide material, such as $SiO_x$) horizontally surrounding and covering at least portions of the third pillar structure 154 at intersections of the third pillar structure 154 and one of the write electrode structures 142. In addition, each of the third pillar structures 154 may, optionally, include one or more conductive materials vertically interposed between the semiconductor material thereof and at least one (e.g., each) of the global digit line structure 136 operatively associated therewith and the local digit line structure 128 operatively associated therewith.

Intersections of the third pillar structures 154 and the write electrode structures 142 may define write transistors 162 (e.g., second switching transistors) of the microelectronic device structure 100. In some embodiments, the write transistors 162 comprise MOS transistors. Channel regions of the write transistors 162 may be positioned within vertical boundaries of the write electrode structures 142; and source/drain regions of the write transistors 162 may vertically neighbor the channel regions, and may be vertically offset from the write electrode structures 142. Tunnel dielectric material of the third pillar structures 154 may be horizontally interposed between the semiconductor material of the third pillar structures 154 and the write electrode structures 142 within vertical boundaries of the write electrode structures 142, and may serve as gate dielectric structures for the write transistors 162.

Still referring to FIGS. 1A and 1B, the microelectronic device structure 100 further includes second conductive contact structures 156 operatively associated with the local digit line structures 128 and the routing structures 150. The second conductive contact structures 156 may individually vertically extend from one of the routing structures 150, and at least to (e.g., to, into) one of the local digit line structures 128 (e.g., the first local digit line structure 128A, the second local digit line structure 128B). Each second conductive contact structure 156 may facilitate electrical communication between the local digit line structure 128 and the routing structure 150 (and, hence, the sense transistor 160, the read transistor 158, and the global digit line structure 136) operatively associated therewith.

The second conductive contact structures 156 may each individually be formed of and include conductive material. By way of non-limiting example, the second conductive contact structures 156 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second conductive contact structures 156 are each individually formed of and include one or more of W, Ru, Mo, and $TiN_y$. Each of the second conductive contact structures 156 may individually be substantially homogeneous, or one or more of the second conductive contact structures 156 may individually be substantially heterogeneous.

Referring collectively to FIGS. 1A through 1C, the source line structures 146, the sense transistors 160, the read transistors 158, and the write transistors 162 may form portions of read/write circuits interposed between the local digit line structures 128 and the global digit line structures 136. The sense transistors 160 are coupled with the local digit line structures 128, are in electrical communication with the source line structures 146, and are also in electrical communication with the global digit line structures 136 through the read transistors 158. The write transistors 162 are in electrical communication with the local digit line structures 128 and the global digit line structures 136.

During read operations for a microelectronic device (e.g., a memory device, such as a 3D NAND Flash memory device) including the microelectronic device structure 100, a local digit line structure 128 and an operatively associated global digit line structure 136 may be pre-charged by way of an operatively associated write transistor 162 and made floating. Thereafter, an operatively associated read electrode structure 140 may be activated. If a read cell current ($I_{cell}$) flows, a potential level of the local digit line structure 128 drops, an operatively associated sense transistor 160 is in an OFF state, and a potential level of the global digit line structure 136 remains at the pre-charged level. Conversely, if a read cell current ($I_{cell}$) does not flow, the potential level of the local digit line structure 128 remains at the pre-charged level, the operatively associated sense transistor 160 is in an ON state, and the potential level of the global digit line structure 136 drops. The potential level of the global digit line structure 136 may be detected by a sense amplifier of a page buffer device operatively associated with the global digit line structure 136. Since each local digit line structure 128 is relatively shorter (e.g., in the X-direction) than the global digit line structure 136 operatively associated therewith, sensing functions may be carried out in a shorter period time relative to sensing functions facilitated through conventional microelectronic device structure configurations. In addition, since parasitic capacitance associated with the local digit line structures 128 is smaller than that associated with the global digit line structures 136, read performance (e.g., sensing speed) may be maintained or improved relative to conventional read performance facilitated by conventional microelectronic device structure configurations, even with relatively smaller read cell currents ($I_{cell}$).

Figure 2A:
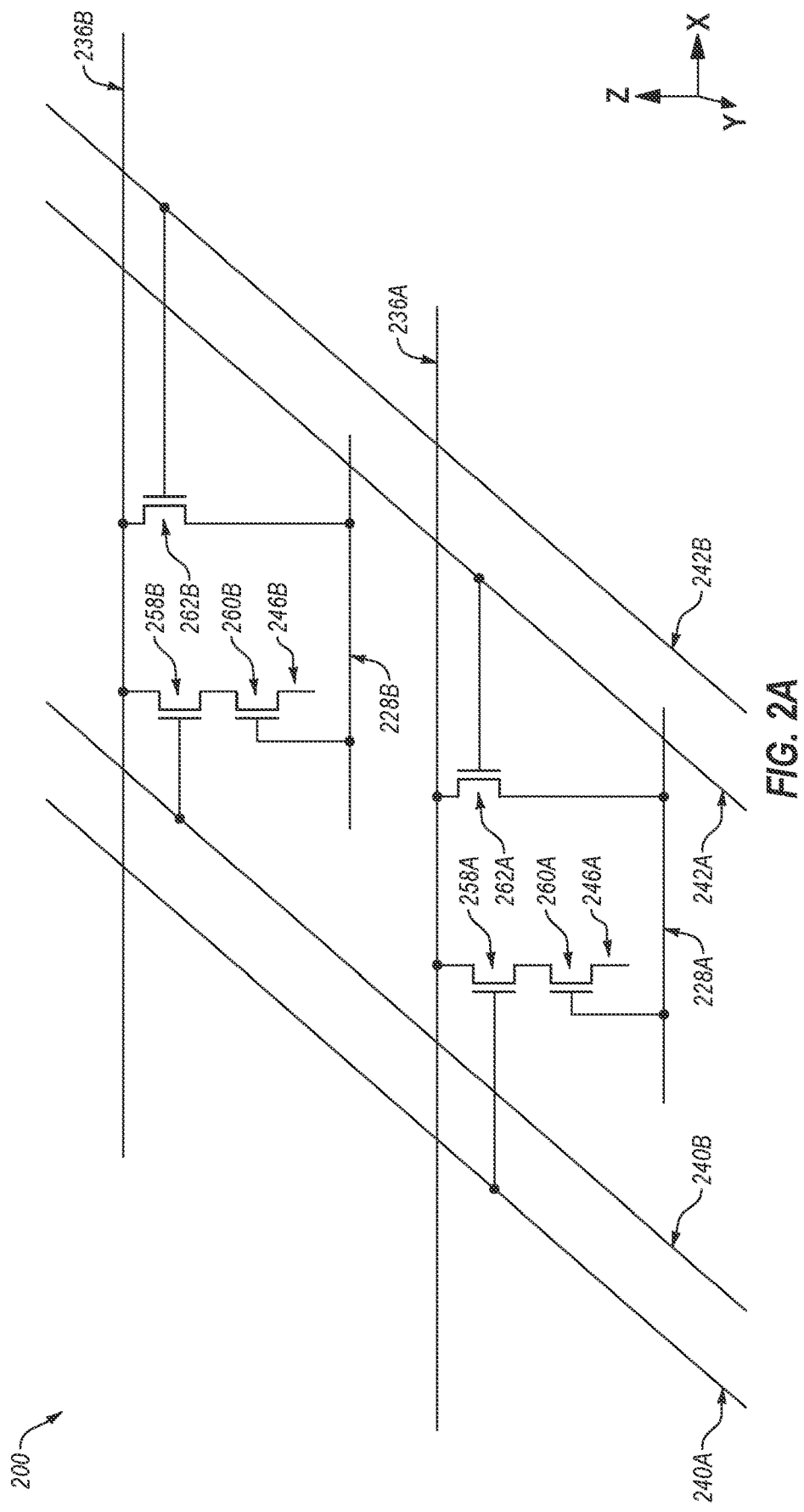
FIG. 2A is simplified, partial schematic perspective view of a microelectronic device structure for a microelectronic device, in accordance with additional embodiments of the disclosure.
Figure 2B:
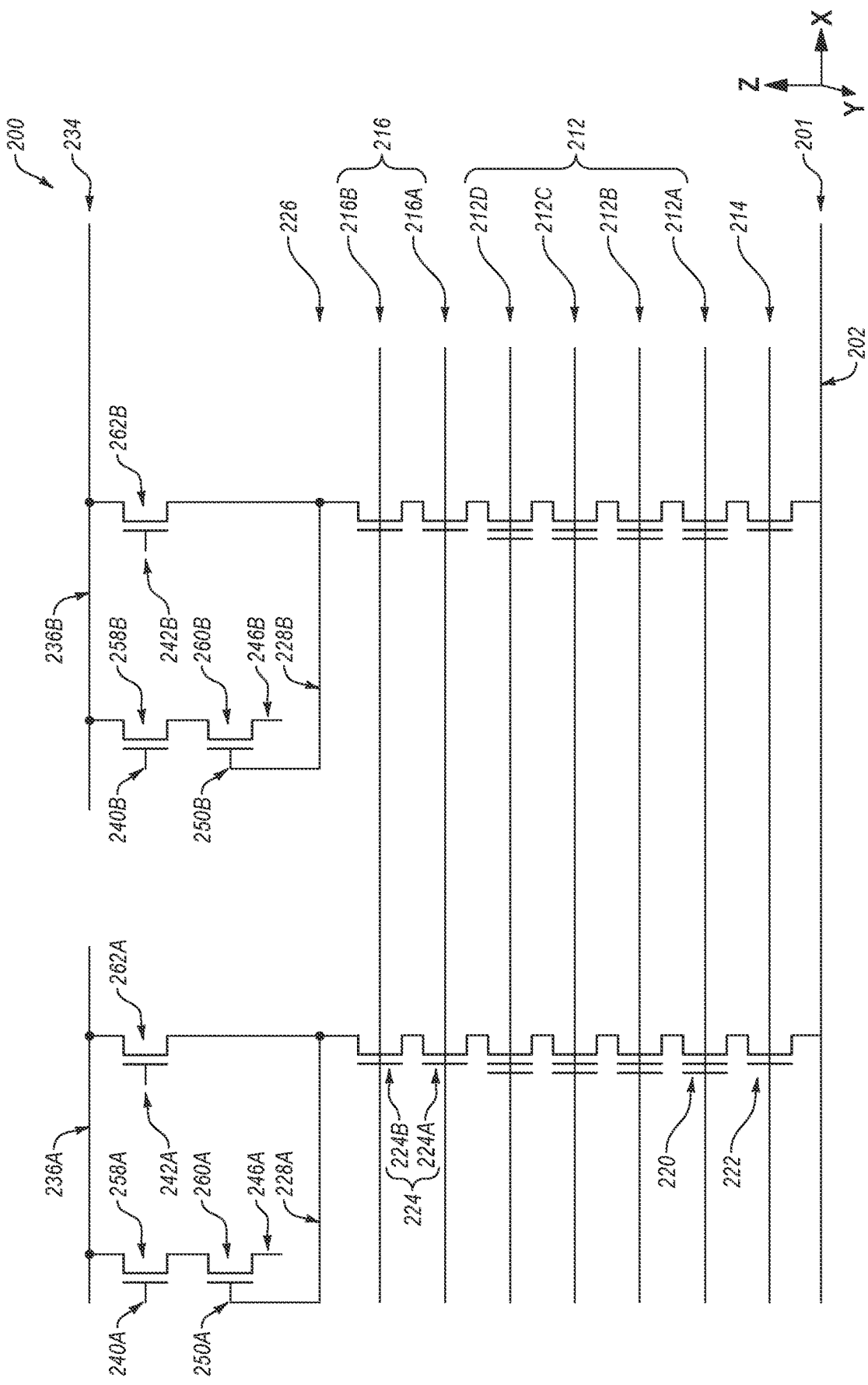
FIG. 2B is a schematic diagram of circuity of a section of the microelectronic device structure shown in FIG. 2A.

In additional embodiments, the microelectronic device structure 100 may be formed to have a different configuration than that previously described with reference to FIGS. 1A through 1C. The microelectronic device structure 100 may, for example, be formed to exhibit a shielded digit line configuration wherein local digit line structures and global digit lines structures horizontally neighboring one another (e.g., in the Y-direction) are operatively associated with different read electrodes and different write electrodes than one another. The shielded digit line configuration may, for example, mitigate undesirable parasitic capacitance between horizontally neighboring digit line structures (e.g., horizontally neighboring local digit line structures, horizontally neighboring global digit line structures) during read operations. By way of non-limiting example, FIG. 2A is simplified, partial schematic perspective view of a microelectronic device structure 200 for a microelectronic device (e.g., a memory device, such as a NAND Flash memory device), in accordance with additional embodiments of the disclosure. FIG. 2B is a schematic diagram of circuity of a section of the microelectronic device structure 200 shown in FIG. 2A. With the description provided below, it will be readily apparent to one of ordinary skill in the art that the structures and devices described herein may be included in relatively larger structures, devices, and systems.

Throughout FIGS. 2A and 2B and the associated description, features (e.g., regions, materials, structures, devices) functionally similar previously described features (e.g., previously described materials, structures, devices) are referred to with similar reference numerals incremented by 100. To avoid repetition, not all features shown in FIGS. 2A and 2B are described in detail herein. Rather, unless described otherwise below, a feature in one or more of FIGS. 2A and 2B designated by a reference numeral that is a 100 increment of the reference numeral of a feature previously described with reference to one or more of FIGS. 1A through 1C will be understood to be substantially similar to the previously described feature. As a non-limiting example, unless described otherwise below, features designated by the reference numerals 236A and 236B in FIGS. 2A and 2B will be understood to respectively be substantially similar to the first global digit line structure 136A and the second global digit line structure 136B previously described herein with reference to FIGS. 1A through 1C. As another non-limiting example, unless described otherwise below, features designated by the reference numerals 228A and 228B in FIGS. 2A and 2B will be understood to be respectively substantially similar to the first local digit line structure 128A and the second local digit line structure 128B previously described herein with reference to FIGS. 1A through 1C.

Furthermore, unless described otherwise below, it will be understood that a feature designated with an alphanumeric reference numeral (e.g., a reference numeral including a combination of alphabetical and numerical characters) is considered to be part of a relatively larger group of functionally similar features collectively identified by a reference numeral only including the numeric portion of the alphanumeric reference numeral. As a non-limiting example, unless described otherwise below, the feature designated by the alphanumeric reference numeral 260A in FIGS. 2A and 2B is considered to be one sense transistor 260 (e.g., a first sense transistor) of a relatively larger group of sense transistors 260, wherein such sense transistors 260 are functionally similar to the sense transistors 160 previously described herein with reference to FIGS. 1A through 1C. As another non-limiting example, unless described otherwise below, the feature designated by the alphanumeric reference numeral 260B in FIGS. 2A and 2B is considered to be another sense transistor 260 (e.g., a second sense transistor) of the relatively larger group of sense transistors 260 that are functionally similar to the sense transistors 160 previously described herein with reference to FIGS. 1A through 1C.

In addition, unless described otherwise below, features of the microelectronic device structure 100 previously described with reference to FIGS. 1A through 1C may also be included, in substantially the same manner (e.g., so as to exhibit substantially similar configurations and positions), within the microelectronic device structure 200 described herein with reference to FIGS. 2A through 2B. For clarity and ease of understanding of the drawings and related description, not all components (e.g., features, structures, devices) of the microelectronic device structure 200 depicted in one of FIGS. 2A through 2B are depicted in the other of FIGS. 2A and 2B.

As shown in FIG. 2A, the microelectronic device structure 200 may be formed to exhibit a shielded digit line configuration wherein local digit line structures 228 (e.g., a first local digit line structure 228A, a second local digit line structure 228B) horizontally neighboring one another in the Y-direction are operatively associated with different read electrodes 240 and different write electrodes 242 than one another, as are global digit line structures 236 (e.g., a first global digit line structure 236A, a second global digit line structure 236B) and additional features (described in further detail below) of the microelectronic device structure 200 operatively associated with the local digit line structures 228. The microelectronic device structure 200 may include pairs of read electrodes 240 (e.g., a first read electrode 240A, a second read electrode 240B) horizontally neighboring one another in the X-direction and extending in parallel in the Y-direction; and pairs of write electrodes 242 (e.g., a first write electrode 242A, a second write electrode 242B) horizontally neighboring one another in the X-direction and extending in parallel in the Y-direction. The pairs of read electrodes 240 are horizontally offset from (e.g., may horizontally alternate with) the pairs of write electrodes 242 in the X-direction. For an individual pair of read electrodes 240, one of the read electrodes 240 (e.g., a first read electrode 240A) may be operatively associated with one local digit line structure 228 (e.g., a first local digit line structure 228A), and the other of the read electrodes 240 (e.g., a second read electrode 240B) may be operatively associated with an additional local digit line structure 228 (e.g., a second local digit line structure 228B) horizontally neighboring the local digit line structure 228 (e.g., the first local digit line structure 228A). In addition, for an individual pair of write electrodes 242 horizontally neighbor the pair of read electrodes 240, one of the write electrodes 242 (e.g., a first write electrode 242A) may be operatively associated with the local digit line structure 228 (e.g., the first local digit line structure 228A), and the other of the read electrodes 240 (e.g., a second write electrode 242B) may be operatively associated with the additional local digit line structure 228 (e.g., the second local digit line structure 228B).

In some embodiments, so-called "odd" local digit line structures 228 and so-called "odd" global digit line structures 236 are operatively associated with different read electrodes 240 and different write electrodes 242 than so-called "even" local digit line structures 228 and so-called "even" global digit line structures 236 horizontally neighboring (e.g., in the Y-direction) the "odd" local digit line structures 228 and the "odd" global digit line structures 236. As a non-limiting example, the first local digit line structure 228A may be considered an "odd" local digit line structure 228, and the first global digit line structure 236A operatively associated with the first local digit line structure 228A may be considered an "odd" global digit line structure 236; and the second local digit line structure 228B may be considered an "even" local digit line structure 228, and the second global digit line structure 236B operatively associated with the second local digit line structure 228B may be considered an "even" global digit line structure 236. As shown in FIG. 2A, the first local digit line structure 228A and the first global digit line structure 236A may both be operatively associated with the first read electrode 240A and the first write electrode 242A; and the second local digit line structure 228B and the second global digit line structure 236B may both be operatively associated with the second read electrode 240B horizontally neighboring the first read electrode 240A and the second write electrode 242B horizontally neighboring the first write electrode 242A. Furthermore, additional features of the microelectronic device structure 200 operatively associated with the first local digit line structure 228A and the first global digit line structure 236A (e.g., in the manners previously described herein with reference to one or more of FIGS. 1A through 1C) may be operatively associated with the first read electrode 240A and the first write electrode 242A; and further features of the microelectronic device structure 200 operatively associated with the second local digit line structure 228B and the second global digit line structure 236B (e.g., in the manners previously described herein with reference to one or more of FIGS. 1A through 1C) may be operatively associated with the second read electrode 240B and the second write electrode 242B. By way of non-limiting example, a first source line structure 246A, a first read transistor 258A, a first sense transistor 260A, and a first write transistor 262A may be operatively associated with (e.g., in the manners previously described herein with reference to one or more of FIGS. 1A through 1C) the first read electrode 240A and the first write electrode 242A; and a second source line structure 246B, a second read transistor 258B, a second sense transistor 260B, and a second write transistor 262B may be operatively associated with (e.g., in the manners previously described herein with reference to one or more of FIGS. 1A through 1C) the second read electrode 240B and the second write electrode 242B.

Referring to FIG. 2B, the microelectronic device structure 200 may be formed to include multiple (e.g., more than one, a plurality of) additional select gate tiers 216 (e.g., upper select gate tiers), such as a first additional select gate tier 216A and a second additional select gate tier 216B vertically overlying the first additional select gate tier 216A. The multiple additional select gate tiers 216 may partially define (e.g., in the manner previously described herein with reference to one or more of FIGS. 1A through 1C) multiple additional select transistors 224 operatively associated with individual vertically extending strings of memory cells 220 of the microelectronic device structure 200. For example, for an individual vertically extending string of memory cells 120, a first additional select transistor 224A and a second additional select transistor 224B may be coupled in series with the vertically extending string of memory cells 120. During read operations for a microelectronic device including the microelectronic device structure 200, states (e.g., ON states, OFF states; active states, inactive states; enhancement states, depletion states; selected states, deselected states) of the first additional select transistor 224A and the second additional select transistor 224B coupled in series with a vertically extending string of memory cells 220 operatively associated with one local digit line structure 228 (e.g., the first local digit line structure 228A) may be controlled relative to states (e.g., ON states, OFF states; active states, inactive states; enhancement states, depletion states; selected states, deselected states) of the first additional select transistor 224A and the second additional select transistor 224B coupled in series with another vertically extending string of memory cells 220 operatively associated with another local digit line structure 228 (e.g., the second local digit line structure 228B). For example, the first additional select transistor 224A and the second additional select transistor 224B coupled in series with an individual vertically extending string of memory cells 220 operatively associated with the first local digit line structure 228A may respectively be provided in an OFF state (e.g., an inactive state, a depletion state, deselected state) and an ON state (e.g., an active state, an enhancement state, a selected state), while the first additional select transistor 224A and the second additional select transistor 224B coupled in series with another individual vertically extending string of memory cells 220 operatively associated with the second local digit line structure 228B may respectively be provided in an ON state and an OFF state; or vice versa.

Thus, a microelectronic device in accordance with embodiments of the disclosure comprises local digit line structures, global digit line structures, source line structures, sense transistors, read transistors, and write transistors. The local digit line structures are coupled to strings of memory cells. The global digit line structures overlie the local digit line structures. The source line structures are interposed between the local digit line structures and the global digit line structures. The sense transistors are interposed between the source line structures and the global digit line structures, and are coupled to the local digit line structures and the source line structures. The read transistors are interposed between and are coupled to the sense transistors and the global digit line structures. The write transistors are interposed between and are coupled to the global digit line structures and the local digit line structures.

Furthermore, a microelectronic device in accordance with additional embodiments of the disclosure comprises a stack structure, a local digit line tier, a global digit line tier, a source line tier, a read/write electrode tier, a routing tier, first pillar structures, and second pillar structures. The stack structure comprises conductive structures and insulative structures vertically interleaved with the conductive structures. The local digit line tier vertically overlies the stack structure and comprises local digit line structures coupled to strings of memory cells vertically extending through the stack structure. The global digit line tier vertically overlies the local digit line tier and comprises global digit line structures. The source line tier is vertically interposed between the local digit line tier and the global digit line tier and comprises source line structures. The read/write electrode tier is vertically interposed between the source line tier and the global digit line tier and comprises read electrode structures and write electrode structures. The routing tier is vertically interposed between the source line tier and the read/write electrode tier and comprises routing structures coupled to the local digit line structures. The first pillar structures comprise semiconductor material. The first pillar structures vertically extend from the global digit line structures, through the read electrode structures and the routing structures, and at least to the source line structures. The second pillar structures comprise additional semiconductor material. The second pillar structures vertically extend from the global digit line structures, through the write electrode structures, and at least to the local digit line structures.

Moreover, a memory device in accordance with embodiments of the disclosure comprises a source plate, a stack structure, local digit lines, strings of memory cells, global digit lines, sense transistors, read transistors, and write transistors. The stack structure overlies the source plate and comprises an access line region comprising local access line structures; a select gate region underlying the access line region and comprising source side select gate (SGS) structures; and an additional select gate region overlying the access line region and comprising drain side select gate (SGD) structures. The local digit lines overlie the stack structure. The strings of memory cells extend through the stack structure and are in electrical communication with the source plate and the local digit lines. The global digit lines overlie the local digit lines and are in electrical communication with page buffer circuitry. Horizontal dimensions of the global digit lines are greater than horizontal dimensions of the local digit lines. The sense transistors overlie and are in electrical communication with the local digit lines. The read transistors overlie the sense transistors and are in electrical communication with the sense transistors and the global digit lines. The write transistors overlie the local digit lines and are in electrical communication with the local digit lines and the global digit lines.

Figure 3:
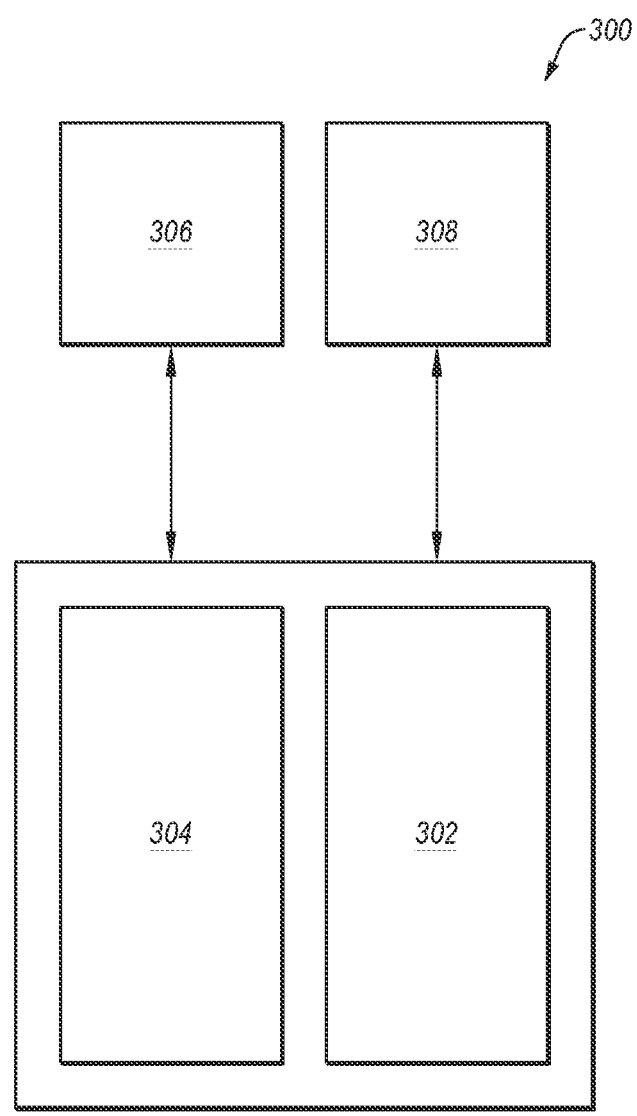
FIG. 3 is a schematic block diagram of an electronic system, in accordance with embodiments of the disclosure.

Microelectronic devices structures (e.g., the microelectronic device structure 100, the microelectronic device structure 200) and microelectronic devices in accordance with embodiments of the disclosure may be used in embodiments of electronic systems of the disclosure. For example, FIG. 3 is a schematic block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, one or more of a microelectronic device structure (e.g., the microelectronic device structure 100, the microelectronic device structure 200) and a microelectronic device previously described herein. The electronic system 300 may further include at least one electronic signal processor device 304 (often referred to as a "microprocessor"). The electronic signal processor device 304 may, optionally, include one or more of a microelectronic device structure (e.g., the microelectronic device structure 100, the microelectronic device structure 200) and a microelectronic device previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100, the microelectronic device structure 200) and a microelectronic device previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, one or more of a monitor, a display, a printer, an audio output jack, and a speaker. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, an electronic system in accordance with embodiments of the disclosure comprises an input device, an output device, a processor device operably connected to the input device and the output device, and a memory device operably connected to the processor device. The memory device comprises strings of memory cells, a source plate, local digit lines, global digit lines, source lines, first vertical transistors, second vertical transistors, and third vertical transistors. The strings of memory cells vertically extend through a stack structure comprising conductive material vertically alternating with insulative material. The source plate vertically underlies the stack structure and is in electrical communication with the strings of memory cells. The local digit lines vertically overlie the stack structure and are in electrical communication with the strings of memory cells. The global digit lines vertically overlie the local digit lines and have greater horizontal lengths than the local digit lines. The source lines are vertically between the local digit lines and the global digit lines. The first vertical transistors are vertically between the source lines and the global digit lines. The first vertical transistors are in electrical communication with the local digit lines and the source lines. The second vertical transistors are vertically between and are in electrical communication with the first vertical transistors and the global digit lines. The third vertical transistors are vertically between and are in electrical communication with the global digit lines and the local digit lines.

The structures and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures and devices of the disclosure may also improve scalability, efficiency, and simplicity as compared to conventional structures and conventional devices.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A 3D NAND Flash memory device, comprising:
   a stack structure comprising tiers each comprising conductive material and insulative material vertically neighboring the conductive material;
   strings of memory cells vertically extending through the stack structure;
   local bit lines vertically overlying and coupled to groups of the strings of memory cells;
   global bit lines vertical overlying the local bit lines;
   vertical sense transistors vertically interposed between the local bit lines and the global bit lines, the vertical sense transistors having gate electrodes coupled to the local bit lines;
   vertical read transistors vertically interposed between and coupled to the vertical sense transistors and the global bit lines; and
   vertical write transistors at a vertical elevation of the vertical read transistors, the vertical write transistors coupled to the local bit lines and the global bit lines.

2. The 3D NAND Flash memory device of claim 1, further comprising source lines vertically interposed between the local bit lines and the vertical sense transistors and coupled to the vertical sense transistors.

3. The 3D NAND Flash memory device of claim 2, wherein:
   source regions of the vertical sense transistors are coupled to the source lines;
   drain regions of the vertical sense transistors are coupled to source regions of the vertical read transistors; and
   drain regions of the vertical read transistors are coupled to the global bit lines.

4. The 3D NAND Flash memory device of claim 2, further comprising:
   additional gate electrodes respectively shared by multiple of the vertical read transistors; and
   further gate electrodes respectively shared by multiple of the vertical write transistors.

5. The 3D NAND Flash memory device of claim 4, wherein:
   the local bit lines, the global bit lines, and the gate electrodes extend in parallel with one another in a first horizontal direction; and
   the source lines, the additional gate electrodes, and the further gate electrodes extend in parallel with one another in a second horizontal direction orthogonal to the first horizontal direction.

6. The 3D NAND Flash memory device of claim 1, wherein:
   a first of the local bit lines is coupled to a first group of the strings of memory cells, a first of the vertical sense transistors, and a first of the vertical write transistors; and
   a first of the global bit lines is coupled to a first of the vertical read transistors and the first of the vertical write transistors.

7. The 3D NAND Flash memory device of claim 6, wherein:
   a second of the local bit lines is coupled to a second group of the strings of memory cells, a second of the vertical sense transistors, and a second of the vertical write transistors; and
   a second of the global bit lines is coupled to a second of the vertical read transistors and the second of the vertical write transistors.

8. The 3D NAND Flash memory device of claim 7, wherein:
   the first of the vertical read transistors and the second of the vertical read transistors share a read gate electrode with one another; and
   the first of the vertical write transistors and the second of the vertical write transistors share a write gate electrode with one another.

9. The 3D NAND Flash memory device of claim 7, wherein:
   the first of the vertical read transistors and the second of the vertical read transistors are operatively associated with different read gate electrodes than one another; and
   the first of the vertical write transistors and the second of the vertical write transistors are operatively associated with different write gate electrodes than one another.

10. The 3D NAND Flash memory device of claim 7, wherein:
    the first of the vertical sense transistors and the first of the vertical read transistors share a first pillar structure with one another, the first pillar structure comprising semiconductor material and vertically extending from and between a source line and the first of the global bit lines; and
    the second of the vertical sense transistors and the second of the vertical read transistors share a second pillar structure with one another, the second pillar structure comprising additional semiconductor material and vertically extending from and between the source line and the second of the global bit lines.

11. A 3D NAND Flash memory device, comprising:
    a stack structure comprising conductive structures and insulative structures vertically alternating with the conductive structures;
    pillar structures vertically extending through the stack structure and individually comprising semiconductor material;
    a local digit line overlying the stack structure and coupled to a group of the pillar structures;
    a source line overlying the local digit line;
    a vertical sense transistor overlying the source line, the vertical sense transistor coupled to the source line and the local digit line;
    a vertical read transistor overlying the vertical sense transistor, the vertical read transistor substantially horizontally aligned with and coupled to the vertical sense transistor;
    a vertical write transistor overlying the vertical sense transistor, the vertical write transistor coupled to the local digit line; and
    a global digit line overlying and coupled to each of the vertical read transistor and the vertical write transistor.

12. The 3D NAND Flash memory device of claim 11, wherein:
    a gate electrode for the vertical sense transistor is coupled to the local digit line and horizontally extends in parallel with the local digit line in a first direction; and
    additional gate electrodes for the vertical read transistor and the vertical write transistor horizontally extend in parallel with one another in a second direction orthogonal to the first direction.

13. The 3D NAND Flash memory device of claim 12, wherein the vertical read transistor is substantially horizontally aligned with the vertical write transistor in the second direction.

14. The 3D NAND Flash memory device of claim 13, wherein the vertical read transistor is substantially horizontally aligned with the vertical sense transistor in each of the first direction and the second direction.

15. The 3D NAND Flash memory device of claim 11, wherein the vertical sense transistor and the vertical read transistor share an additional pillar structure with one another, the additional pillar structure comprising additional semiconductor material and vertically extending from the global digit line to the source line.

16. The 3D NAND Flash memory device of claim 15, further comprising a further pillar structure operatively associated with the vertical write transistor, the further pillar structure comprising further semiconductor material and vertically extending from the global digit line to the local digit line.

17. The 3D NAND Flash memory device of claim 16, wherein the additional pillar structure and the further pillar structure at least partially overlap one another in a first horizontal direction orthogonal to a second horizontal direction in which the local digit line and the global digit line each substantially linearly extend.

18. The 3D NAND Flash memory device of claim 17, wherein the local digit line and the global digit line at least partially overlap one another in the first horizontal direction.

19. The 3D NAND Flash memory device of claim 11, further comprising a group of conductive contact structures vertically extending from the local digit line to the group of the pillar structures, the group of conductive contact structures coupling the local digit line to the group of the pillar structures.

20. An electronic system, comprising:
an input device;
an output device;
a processor device operably connected to the input device and the output device; and
a 3D NAND Flash memory device operably connected to the processor device and comprising:
a stack structure comprising tiers each comprising conductive material and insulative material vertically neighboring the conductive material;
strings of memory cells vertically extending through stack structure;
local digit lines vertically overlying the stack structure, each of the local digit lines coupled to a respective group of the strings of memory cells;
source lines vertically overlying the local digit lines;
vertical sense transistors vertically overlying and coupled to the source lines, gate electrodes for the vertical sense transistors coupled to and horizontally extending in parallel with the local digit lines;
vertical read transistors vertically overlying and coupled to the vertical sense transistors, additional gate electrodes for the vertical read transistors horizontally extending orthogonal to the local digit lines;
vertical write transistors at a vertical elevation of the vertical read transistors and coupled to the local digit lines, further gate electrodes for the vertical write transistors horizontally extending orthogonal to the local digit lines; and
global digit lines overlying and coupled to the vertical read transistors and the vertical write transistors, the global digit lines horizontally extending in parallel with the local digit lines.

* * * * *

UNITED STATES PATENT AND TRADEMARK OFFICE
CERTIFICATE OF CORRECTION

PATENT NO. : 11,908,512 B2
APPLICATION NO. : 18/148684
DATED : February 20, 2024
INVENTOR(S) : Tomoharu Tanaka and Yoshiaki Fukuzumi It is certified that error appears in the above-identified patent and that said Letters Patent is hereby corrected as shown below:

In the Specification

| | | |
|---|---|---|
| Column 3, | Lines 51-52, | change "proximate e.g., horizontally" to --proximate (e.g., horizontally-- |
| Column 4, | Line 55, | change "iridium (Jr), nickel" to --iridium (Ir), nickel-- |
| Column 5, | Line 11, | change "oxide (MgO)), at" to --(oxide ($MgO_x$)), at-- |
| Column 9, | Line 36, | change "as $SiO_2$, $SiN_y$," to --as $SiO_2$; $SiN_y$,-- |

Signed and Sealed this
Twenty-third Day of April, 2024

Katherine Kelly Vidal
*Director of the United States Patent and Trademark Office*